United States Patent [19]
Ellenberger

[11] Patent Number: 4,722,137
[45] Date of Patent: Feb. 2, 1988

[54] HIGH FREQUENCY HERMETICALLY SEALED PACKAGE FOR SOLID-STATE COMPONENTS

[75] Inventor: John C. Ellenberger, Santa Clara, Calif.

[73] Assignee: Hewlett-Packard Company, Palo Alto, Calif.

[21] Appl. No.: 826,419

[22] Filed: Feb. 5, 1986

[51] Int. Cl.$^4$ ............................................. H05K 3/30
[52] U.S. Cl. ........................................ 29/841; 357/74; 357/80; 357/81; 174/52 FP
[58] Field of Search .................... 29/841, 842, 827; 774/68.5, 52 FP; 357/74, 80, 81

[56] References Cited

U.S. PATENT DOCUMENTS

| | | | |
|---|---|---|---|
| 3,404,319 | 10/1968 | Tsuji et al. | 174/52 FP X |
| 3,665,592 | 5/1972 | Apospors | 357/74 X |
| 3,748,544 | 7/1973 | Noren | 357/74 X |
| 3,893,193 | 7/1975 | Anazawa et al. | 174/52 FP X |
| 3,936,864 | 2/1976 | Benjamin | 357/74 |
| 4,023,198 | 5/1977 | Malone et al. | 357/74 X |
| 4,137,628 | 2/1979 | Suzuki | 29/842 X |
| 4,246,697 | 1/1981 | Smith | 29/827 |
| 4,527,010 | 7/1985 | Anazawa et al. | 357/74 X |

FOREIGN PATENT DOCUMENTS 60-127752 8/1985 Japan ............................. 29/827

Primary Examiner—Howard N. Goldberg
Assistant Examiner—Carl J. Arbes
Attorney, Agent, or Firm—James M. Williams

[57] ABSTRACT

A package for discrete components is hermetically sealed, has very low parasitic inductance and capacitance, small size, 50 ohm input and output leads and is suitable for surface mount applications. The package comprises a ceramic base and a ceramic lid, hermetically sealed together with a solder glass seal. The ceramic base has metallized areas deposited on only the top side, to which the leads are brazed. The contacts of the component are mounted directly to the leads. After brazing, the braze and leads are nickel plated. Then a photoresist mask layer is applied to the area where the solder glass seal will be made and the photoresist is cured. The nickel plating is deoxidized and the gold plating is applied. Next, the photoresist layer is removed, exposing the nickel plating and alumina in the seal area so that the lid can be attached with the solder glass to form an effective hermetic seal.

13 Claims, 5 Drawing Figures

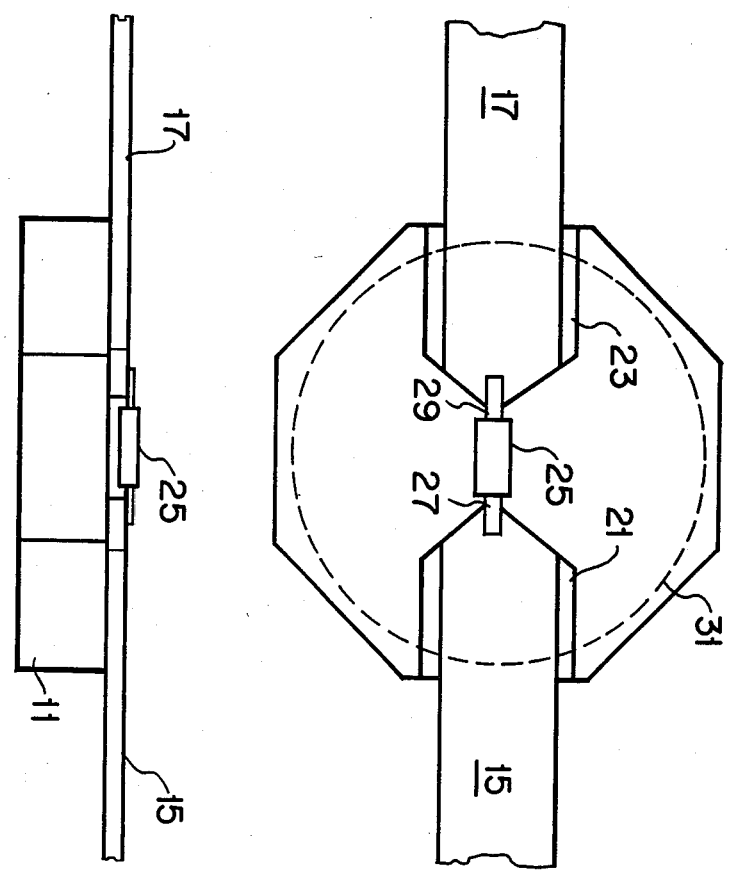

HIGH FREQUENCY HERMETICALLY SEALED PACKAGE FOR SOLID-STATE COMPONENTS

BACKGROUND AND SUMMARY OF THE PRIOR ART

The invention relates to hermetically sealed packages for solid state components, in particular for high frequency applications, and to a process for manufacturing such packages.

There are several different types of packages being used in the microwave industry for discrete small signal components and devices. These packages range from 6 GHz to 20 GHz in limiting frequency and vary from very high reliability ceramic packages to low cost plastic packages. However, to date there has not been a package available that combines all of the desirable features for such a package including hermetic sealing, small size, surface mount capability and microstrip compatibility, operating frequency up to 20 GHz and the ruggedness and reliability to meet the JAN-S requirements for environmental testing.

The problem has been that the requirements for these features tend to be mutually contradictory. To be hermetic and meet the JAN-S requirements, the package usually has to be fairly large in order to have good lead strength and to have room for a hermetic seal. Conversely, to operate up to 20 GHz, the package must be made very small to prevent cavity oscillation. Also, the parasitic capacitance from lead to lead must be very low, on the order of 0.05 pF, but the dielectric constants of hermetic ceramic package materials are fairly high, so line coupling must be kept to a minimum. To operate well in the 20 GHz range, the leads must be close to 50 ohm transmission lines, but this imposes physical and electrical constraints on the sealing material and makes hermeticity more difficult to achieve.

There are several packages that have some, but not all, of the features listed above. One prior solution is a package that has a ceramic base metalized on one side to which the leads are brazed. A beam lead diode is attached directly to the leads and a dot of epoxy is applied to cover the diode. This package has small inductance and capacitance and also small size but does not meet the JAN-S requirements and is not hermetic because the epoxy coating does not make a hermetic seal.

A second approach is a package using a co-fired ceramic base which has the cavity for holding the component. This construction provides good hermetic sealing and good lead strength, so it meets the environmental requirements for JAN-S testing. However, this construction requires the leads to be brazed to the backside of the base and a metalized seal ring for solder sealing a metal lid. Thus there are three metalized surfaces in the package, and the geometry of these surfaces creates relatively high parasitic inductance and capacitance because of excessive line coupling. Due to its high parasitic inductance and capacitance and large size, this type of package cannot be in applications above 12 GHz. It also has a relatively high piece part and manufacturing cost.

A third approach has a frequency range to above 18 GHz and meets the JAN-S level testing but is very expensive to manufacture, has a relatively high parasitic capacitance and inductance, and is difficult to test and mount in circuits. This package is a ceramic cylinder with metalization at both ends so that metal lugs can be soldered in. The device is mounted on one of the end lugs, with bond wires extending from the device to the second end lug. The second end lug is then soldered on to make the seal.

Yet another approach is a package with metalization on both sides of a ceramic base with the top metalization for mounting the device and the bottom metalization for brazing the leads. A lid with a cavity is attached to the top surface with a solder glass seal. This package is thus hermetic and meets the JAN-S environmental requirements but again suffers high parasitic inductance and capacitance and therefore cannot be used in applications above 12 GHz.

SUMMARY OF THE INVENTION

The invention is a package for discrete components that is hermetically sealed, has very low parasitic inductance and capacitance, small size, 50 ohm input and output leads and is suitable for surface mount applications, and a process for manufacturing the package. As a result of the low parasitic inductance and capacitance and its small size, the package can be used in applications for frequencies above 20 GHz. Because it is hermetically sealed and because the design permits sturdy attachment of the leads, the package meets the stringent environmental testing requirements for JAN-S testing (space quality level testing) Because the component parts of the package and the assembly processes itself are particularly adapted to automated production, the package has a very low piece part and manufacturing cost.

The invention realizes all of these advantages with a two piece package comprising a ceramic base and a ceramic lid, hermetically sealed together with a solder glass seal. The ceramic base has metalization areas only on the top side, to which the leads are brazed. The lid which has a cavity to house the component, and the contacts of the component are mounted directly to the leads. The lid is sealed to the base with a solder glass (lead oxide glass) seal over the brazed leads. Restricting the metalization to only one side of the base keeps the parasitic capacitance very low. Having the leads come out of the middle of the package keeps the inductance very low thus increasing the useful frequency range. Brazing the leads to the package allows the package to be very small and still have high adhesion strength. Mounting the contacts of the component directly to the leads also keeps the package small. The solder glass provides a hermetic seal over the leads and braze and adds sturdiness to help meet the environmental requirements of JAN-S testing. Because brazing the leads to the base provides the primary adhesion strength, the size of the solder glass seal can be made the minimum necessary for a hermetic seal, thus keeping the overall package size small and increasing the frequency range.

The order in which the assembly steps for the package are performed is important in achieving these advantages. The problem arises because of the conflicting requirements for brazing the leads to the alumina base, gold plating the leads to meet the JAN-S requirements and providing a suitable surface for a hermetic solder glass seal.

According to the present invention this difficulty is overcome by performing the cleaning and plating steps in a particular order and protecting the nickel surfaces in the hermetic sealing area with a photoresist layer during the gold plating step. The braze and leads are first nickel plated. Then a photoresist mask layer is applied to the area where the solder glass seal will be made and the photoresist is cured. The nickel plating is deoxidized and the gold plating is applied. Next, the photoresist layer is removed, exposing the nickel plating and alumina in the seal area so that the lid can be attached with the solder glass to form an effective hermetic seal.

DETAILED DESCRIPTION OF THE DRAWINGS

FIG. 2 shows top and elevational views of the base of the package shown in FIG. 1.

DETAILED DESCRIPTION OF THE INVENTION

Figure 1:
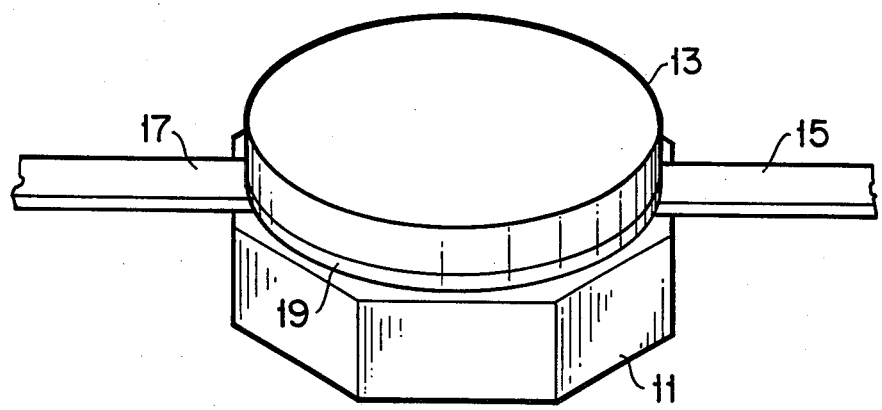
FIG. 1 shows an external view of a package constructed according to the teachings of the invention.

The package for discrete microwave components produced according to the teachings of the invention, shown in FIG. 1, comprises a base 11 for mounting the discrete component and a lid 13 which has a cavity for enclosing the component. Leads 15 and 17 are brazed to the top of base 11 and connect the component to the circuit in which it is to be mounted. A layer of solder glass (lead oxide glass) 19 provides a hermetic seal between base 11 and lid 13.

Base 11 and lid 13 are made of 96% alumina which has a dielectric constant of 8.5. Leads 15 and 17 are made of Kovar alloy (ASTM alloy F15) which has the same coefficient of thermal expansion as the alumina. In the finished package, leads 15 and 17 are gold plated to meet the JAN-S environmental standards.

A more detailed view of base 11 showing the attachment of the leads 15 and 17 to the top of the base and the mounting of component 25 between the leads 15 and 17 is shown in FIG. 2. In the embodiment shown in FIG. 2, base 11 is an octagonal alumina wafer 0.015 inches thick. The octagonal shape provides for distribution of the stresses on the brazed areas, relatively small maximum diagonal measurement, room to accommodate the solder glass seal and corners which can be used to align the leads over the metalization pads during the brazing operation. Two metalization pads 21 and 23 are deposited on the top surface of the base 11 to provide a surface for brazing leads 15 and 17. While any suitable metal can be used for the metalization pads, tungsten has been found to be particularly advantageous. Note that there is no metalization on the bottom or the sides of base 11, allowing the parasitic inductance and capacitance of the package to be kept to a minimum.

Leads 15 and 17 are brazed to metalization pads 21 and 23 on the top of base 11. The inventor has found that CuSil brazing material provides very good adhesion and bond strength between the leads and the base. After brazing, the leads and the exposed braze material are nickel plated with electrolytic or electroless nickel. This nickel layer over the leads and the exposed braze provides for a hermetic seal with the solder glass.

FIG. 2 also shows the mounting of component 25 on leads 15 and 17. Component 25, which in the embodiment depicted is a beam lead diode, is attached to the package leads via beam leads 27 and 29. Several attachment methods can be used but series resistance welding has been found to be a particularly well adapted and suitable technique.

FIG. 2 also shows the area 31 on which photoresist is deposited before gold plating leads 15 and 17. After gold plating, the photoresist layer is removed leaving an exposed alumina surface and a nickel plated surface over the leads and braze, in the area where the solder glass seal will be formed. These surfaces form a good hermetic seal when lid 13 is attached to base 11.

Figure 3:
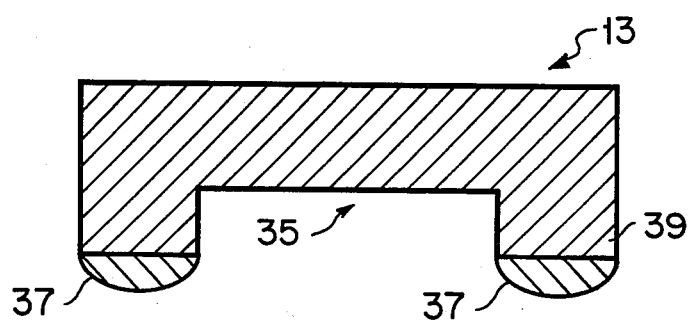
FIG. 3 shows a top view and a cross sectional view of the lid of the package shown in FIG. 1.

Some details of the construction of lid 13 are shown in FIG. 3 Lid 13 is disk of alumina, 0.015 in. thick, with a cavity 35 which provides space to house the component 25. A ring of solder glass 37 is deposited on the bottom surface of wall 39 surrounding cavity 35. In order to hermetically seal component 25 inside cavity 35, lid 13 is placed on base 11 so that the solder glass ring overlays area 31, then the assembly is heated to flow the solder glass and form the hermetic seal. This operation can be done, for example, in a infrared belt furnace. In the embodiment shown, the solder glass is a lead oxide glass in the T191BF family (equivalents are KC-402 and SG-202). This glass was found to have good strength, low sealing temperature (about 420° C.) and a relatively low dielectric constant (12.2).

It is important to braze the leads to the base in order to provide sufficient adhesion strength to meet the JAN-S requirement (8 ounce minimum pull strength) and to meet the size constraint for microwave operation. Brazing the leads to the top of the base keeps the parasitic capacitance to a minimum and also allows for a 50 ohm input and output impedance in both surface mount and microstrip mounting configurations. Furthermore, brazing the leads to the same side of the base on which the component is mounted avoids the problems caused by having metalization on the sides of the base to connect leads brazed to the bottom to the component mounted on the top. Placing the solder glass seal over the leads on the top of the base provides added strength helping lead adhesion and giving a margin of safety to the lead strength for post assembly lead forming. However, having the leads on a common surface with the solder glass seal creates a problem because of the JAN-S requirement that the leads be gold plated.

The problem arises because of the conflicting requirements for brazing the leads to the alumina base, gold plating the leads to meet the JAN-S requirements and providing a suitable surface for a hermetic solder glass seal. Solder glass will not form a hermetic seal with the gold or the braze material. To form a hermetic seal over the leads, the leads and braze material must be nickel plated. However, in order to meet the JAN-S standard, the leads must then be overplated with gold. If the gold plating is done after the solder glass seal is made, the nickel plating must have any oxide removed from areas not covered by the solder glass. But the reducing reagent attacks the lead oxide glass and can result in a loss of hermeticity, mechanical strength and electrical isolation. On the other hand, since the lead oxide glass will not form a hermetic seal with gold plated surfaces, if the gold plating is done before the solder glass seal is made, it can be difficult to form an effective hermetic seal.

The present invention overcomes this problem by performing the plating and cleaning steps in a particular order and adding a protective coating step to shield the hermetic seal surfaces during the gold plating step. The braze and leads are first nickel plated. Then a photoresist mask layer is applied to the area where the solder glass seal will be made and the photoresist is cured. The nickel plating is deoxidized and the gold plating is applied. Next, the photoresist layer is removed, exposing the nickel plating and alumina surfaces in the seal area so that the lid can be attached with the solder glass to form an effective hermetic seal.

Figure 4:
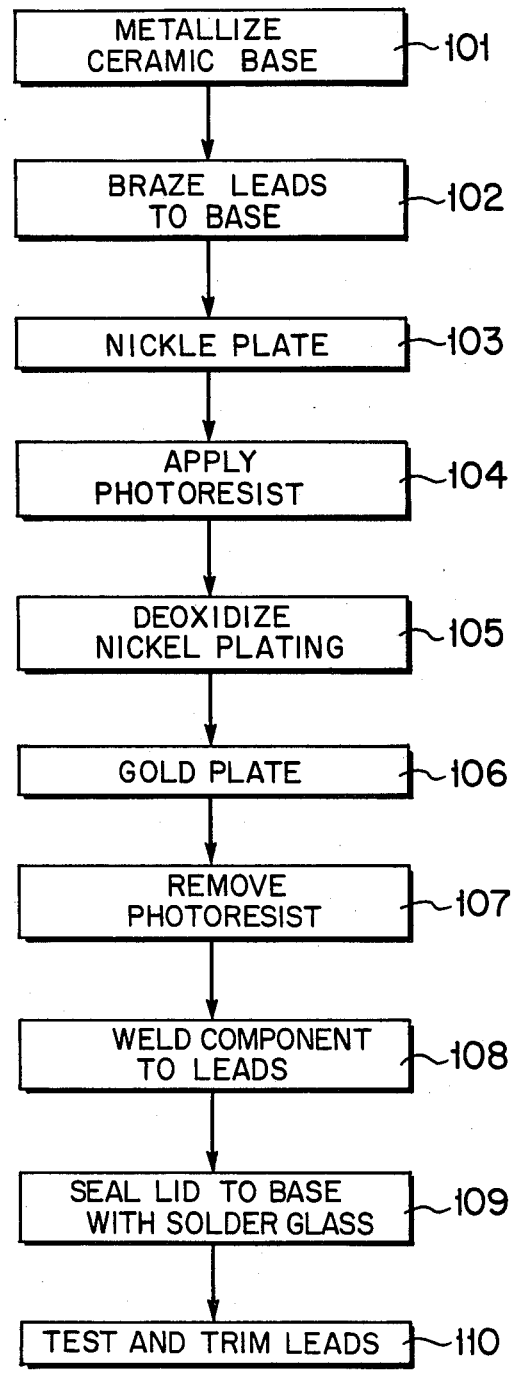
FIG. 4 is a flow chart showing the process steps used for assembly of a package in accordance with the teachings of the invention.

The process for assembling the package procedes according to the flowchart depicted in FIG. 4. First, in step 101, the metalization layers 21 and 23 are deposited on the top of alumina base 11. Next, in step 102, the leads 15 and 17 are brazed to the metalization pads, step 102. Then, in step 103, the leads and the exposed braze are nickel plated using electrolytic or electroless nickel. This provides a surface that will form a hermetic seal with the solder glass over the Kovar and braze surfaces on the leads. Next, in step 104, a photoresist layer is applied over the nickel plating layer in the area 31 (see FIG. 2) where the lead oxide glass seal between the lid and the base will be formed. The photoresist protects the nickel plated surfaces in the area where the leads penetrate the hermetic seal, preventing gold plating in those areas. Next, in step 105 the exposed nickel plating on leads 15 and 17 is deoxidized with a strong reducing agent, for example, a 25% solution of hydrochloric acid. The leads are then gold plated, in step 106. If the package is subject to less stringent standards that do not require gold plating, the leads can be plated with some other solderable metal, tin for example, that meets the applicable standard. After gold plating, the photoresist layer is removed, in step 107, exposing the underlying nickel plating and alumina surfaces. Component 25 is then welded between leads 15 and 17, in step 108. As discussed above, series resistance welding has proven to be a particularly useful technique for this operation. Finally, in step 109, the lid 13 with a ring of lead oxide solder glass 37 on the lower surface is placed on top of base 11 over component 25 and the assembly is heated so the solder glass flows to form a hermetic seal between lid 13 and the nickel plated leads and braze and exposed alumina surfaces of base 11. The packaged component is then ready for final lead forming, lead trimming and electronic testing.

Figure 5:
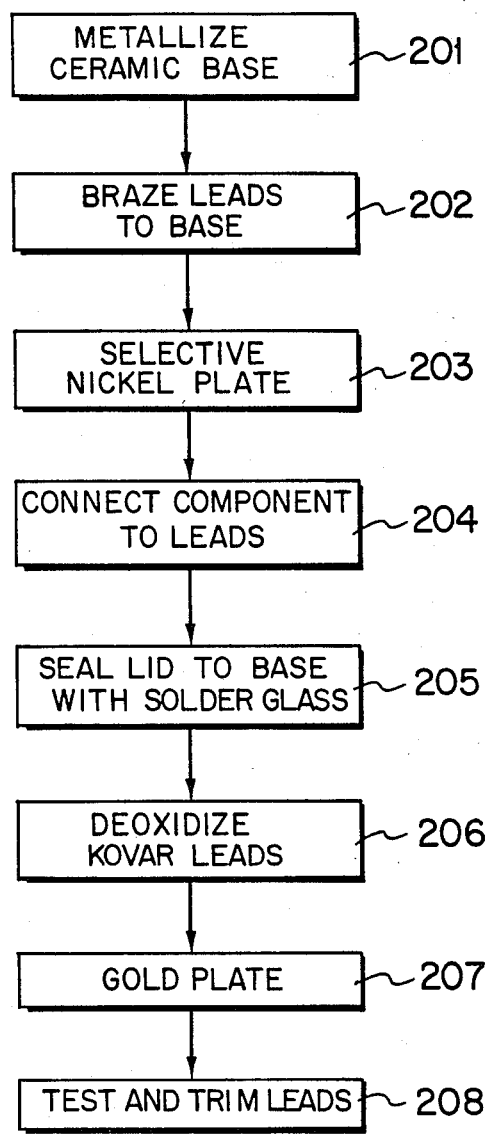
FIG. 5 is a flow chart showing alternative process steps used for assembly of a package in accordance with the teachings of the invention.

An alternative method of assembling the package is illustrated in the flowchart shown in FIG. 5. This method is especially suitable for non-beam lead devices. In this process, the gold plating is done after the package has been sealed with solder glass. The leads are selectively nickel plated in the seal area 31, leaving the Kovar material exposed on those parts of the leads to be gold plated. Alternatively, the seal area portions of the leads and braze could be nickel plated with a silver overplate, or could be silver plated, if the component will be connected to the leads by bond wires. The package is then sealed. The Kovar must thereafter be deoxidized to prepare for the gold plating, but a weaker reducing agent, which does not attack the lead oxide solder glass, can be used to deoxidize the Kovar.

Referring to FIG. 5, the metalization and brazing steps, 201 and 202, are performed as in the first embodiment. Next, in step 203, the leads are selectively nickel or silver plated in the area 31 shown in FIG. 2. This can be done by masking the surfaces to remain unplated during the plating procedure. Next, in step 204, component 25 is attached to the leads 15 and 17. Then, in step 205, the lid 13 is sealed to the base 11 as in step 109 of the first embodiment. This leaves bare Kovar leads extending from the hermetically sealed package. Then, in step 206, the Kovar leads are deoxidized with a reducing agent, for example, a 50% solution of sulfuric acid. This reducing agent is not as strong as the hydrochloric acid solution used to deoxidize the nickel plated surfaces, and does not degrade the lead oxide solder glass seal. After deoxidizing, the Kovar can be gold plated, in step 207. Finally the packaged component is ready for final lead forming, lead trimming, and electronic testing, in step 208.

Although the package depicted and described herein shows a two lead component, the package is equally suitable for multiple lead components. The octagonally shaped base is particularly suited to components having up to eight leads.

I claim:

1. A method of assembling a hermetically sealed, high reliability package for high frequency electronic components, said package comprising a ceramic base, metal leads for connecting and mounting the component and a ceramic lid for covering the component, the method comprising the following steps performed in the sequence set forth:

depositing a metalization layer on the top surface of the base in the areas to which the leads are to be attached;

brazing the leads to the metalized areas;

nickel plating the leads and the exposed brazing;

applying a photoresist layer over the area of the top surface of the base in which the hermetic seal is to be formed and deoxidizing the nickel plated surfaces of the leads not covered by the photoresist layer;

overplating the nickel plated surfaces of the leads not covered by the photoresist layer with a solderable metal;

removing the photoresist layer to expose the nickel plated surfaces of the leads not overplated;

mounting the electronic component to the leads;

attaching the lid to the base with a layer of nonconducting, flowable material that forms a hermetic seal between the ceramic surface of the lid, the nickel plated surfaces of the leads and braze and the ceramic surface of the top of the base.

2. The method of claim 1 wherein the nonconducting, flowable material used in the attaching step is a lead oxide solder glass.

3. The method of claim 2 wherein the mounting step is accomplished by series resistance welding.

4. The method of claim 3 wherein the solderable metal is gold.

5. The method of claim 1 wherein the photoresist layer is applied before deoxidizing the nickel plated surfaces.

6. The method of claim 1 wherein the nickel plated surfaces are deoxidized before the photoresist layer is applied and the photoresist layer is cured in a nonoxidizing atmosphere.

7. A method of assembling a hermetically sealed, high reliability package for high frequency electronic components, said package comprising a ceramic base, metal leads for connecting and mounting the component and a ceramic lid for covering the component, the method comprising the following steps performed in the sequence set forth:

depositing a metalization layer on the top surface of the base in the areas to which the leads are to be attached;

brazing the leads to the metalized areas;
selectively nickel plating the leads and the exposed brazing only in the areas in which the hermetic seal is to be formed;
mounting the electronic component to the leads;
attaching the lid to the base with a layer of nonconducting, flowable material that forms a hermetic seal between the ceramic surface of the lid, the selectively plated surfaces of the leads and braze and the ceramic surface of the top of the base;
deoxidizing the surfaces of the leads extending from the sealed ceramic package;
overplating the surfaces of the leads extending from the ceramic package with a solderable metal.

8. The method of claim 7 wherein the nonconducting, flowable material used in the attaching step is a lead oxide solder glass and the leads are made of a metal which forms a surface oxide capable of being reduced by a reducing agent that does not degrade the lead oxide glass.

9. The method of claim 8 wherein the leads are made of Kovar alloy.

10. The method of claim 7 further comprising, after the nickel plating step, overplating with silver the nickel plated surfaces of the leads and braze.

11. A hermetically sealed, high reliability package for a high frequency electronic component comprising:
a ceramic base having a top surface and a bottom surface;
metalized areas deposited only on the top surface of the base;
leads brazed to the metalized areas for mounting the electronic component and for making electrical connections to the component, the surfaces of the leads and brazing being nickel plated with that portion of the surface of the leads extending past the edge of the top surface of the base being overplated with a solderable metal;
a ceramic lid having a cavity for housing the component and a bottom surface sealed to the top surface of the base around the periphery of the cavity by a layer of nonconducting flowable material which forms a hermetic seal between the ceramic surface of the lid, the nickel plated surfaces of the leads and brazing, and the ceramic surface of the top of the base.

12. The package of claim 11 wherein the base and the lid are 96% alumina, the leads are Kovar alloy, and the nonconducting flowable material is a lead oxide solder glass.

13. The package of claim 12 wherein the base is substantially an octagonal parallelpiped.

* * * * *